US012681545B2

(12) United States Patent
French, Jr. et al.

(10) Patent No.: US 12,681,545 B2
(45) Date of Patent: Jul. 14, 2026

(54) FRONT INPUT/OUTPUT (I/O) EXPANSION MODULE FOR A COMPUTING DEVICE

(71) Applicant: LENOVO ENTERPRISE SOLUTIONS (SINGAPORE) PTE LTD., Singapore (SG)

(72) Inventors: Michael Dudley French, Jr., Morrisville, NC (US); Bradley Paul Antczak, Morrisville, NC (US); Nathan Okenna Onyejiaka, Morrisville, NC (US); Paul Spence Sawyer, Morrisville, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 392 days.

(21) Appl. No.: 18/446,007

(22) Filed: Aug. 8, 2023

(65) Prior Publication Data

US 2025/0053207 A1     Feb. 13, 2025

(51) Int. Cl.
| | |
|---|---|
| *G06F 1/183* | (2026.01) |
| *G06F 1/20* | (2006.01) |
| *H05K 7/14* | (2006.01) |
| *H05K 7/20* | (2006.01) |

(52) U.S. Cl.
CPC ............... *G06F 1/183* (2013.01); *G06F 1/20* (2013.01); *H05K 7/1461* (2013.01); *H05K 7/20136* (2013.01)

(58) Field of Classification Search
CPC .......... G06F 1/183; G06F 1/186; G06F 1/187; G06F 1/1632; G06F 1/20; H05K 7/1461; H05K 7/20136; H05K 7/1457; H05K 7/1439; H05K 7/1485; G06G 3/0227
See application file for complete search history.

(56) References Cited

U.S. PATENT DOCUMENTS

| | | | |
|---|---|---|---|
| 8,369,092 B2 * | 2/2013 | Atkins | ................... G06F 1/187 361/730 |
| 10,108,575 B2 * | 10/2018 | Eide | .................... G06F 13/4295 |
| 11,294,840 B2 * | 4/2022 | Zhang | ................. G06F 13/4282 |

OTHER PUBLICATIONS

Cyclone Microsystems, PCI Express Expansion Systems, OCI Express Boards and Systems for Embedded Programs, URL: http://www.cyclone.com/products/expansion_systems/index.php, printed Jan. 18, 2023, 2 pages.
Paul Kirvan, hot/cold aisle, TechTarget, Data Center, URL: https://www.techtarget.com/searchdatacenter/definition/hot-cold-aisle, last updated Feb. 2022, printed Jan. 18, 2023, 5 pages.
Trenton Systems, NBMe JBOD Enclosures, Maximum All-Flash Storage Capacity, 2021 Trenton Systems, Inc., URL: https://www.trentonsystems.com/products/rugged-storage-systems/jbod-enclosure, printed Jan. 18, 2023, 12 pages.

* cited by examiner

*Primary Examiner* — Idriss N Alrobaye
*Assistant Examiner* — Richard B Franklin

(57) ABSTRACT

An input/output (I/O) expansion module includes a first substrate, and an expansion slot disposed on the first substrate. The expansion slot is configured to be communicatively coupled to a backplane slot disposed on a backplane of a computing device. The computing device is external to the I/O expansion module.

18 Claims, 6 Drawing Sheets

500

Fans 508

Power Supply Card 504

502 PCIe Riser Card

506

512 Power Signal Cable

Power Cable (Optional)

516

510 PCIe Conversion Module

Rack Unit
100

Server 104

CPU 106

RAM 108

Backplane
110

Backplane Slot(s) 112

118

Front I/O Expansion Module 114

Expansion Slot(s) 116

400

FRONT INPUT/OUTPUT (I/O) EXPANSION MODULE FOR A COMPUTING DEVICE

BACKGROUND

Field of the Disclosure

The field of the disclosure is data processing, or, more specifically, apparatus and systems for a front input/output (I/O) expansion module for a computing device.

Description of Related Art

General-purpose enterprise servers are typically designed to support storage in the front of the server and I/O expansion in the rear of the device. Servers deployed in cloud service provider (CSP) datacenters typically leverage network storage and do not require in-server storage. However, servers in a CSP datacenter will typically be required to support a specialized network adapter (e.g., a "smart network interface controller (NIC)") to implement the functions of the cloud. Smart NIC adapters are typically high power and therefore require an effective cooling solution. Smart NIC adapters installed in the front of a server are typically subject to less pre-heated air and can be more effectively cooled compared to adapters which are installed in the back of a server that are subject to pre-heat from storage, central processing units (CPUs), and memory. Large datacenters, such as those used by CSPs, typically utilize a "hot and cold aisle" configuration for maximum efficiency. In such datacenters, a "cold aisle" is located in front of a server rack in which the ambient air is relatively cooler than a "hot aisle" located at the back of the server rack. CSP users typically have a strong preference for servers that support front I/O access for better cooling and to provide physical access to network devices from the cold aisle. Physical access to the front of the server is desired to be maximized while physical access to the back of the server is minimized. This datacenter configuration increases the need to provide for front I/O capabilities in a server.

SUMMARY

An apparatus, and system for a front I/O expansion module for a computing device according to various embodiments are disclosed in this specification. In accordance with one aspect of the present disclosure, an I/O expansion module comprises a first substrate, and an expansion slot disposed on the first substrate. The expansion slot is configured to be communicatively coupled to backplane slots disposed on a backplane of a computing device external to the I/O expansion module.

In an embodiment, the first substrate comprises a riser card. In another embodiment, the expansion slot comprises a peripheral component expansion slot. In another embodiment, the peripheral component expansion slot comprises Peripheral Component Interconnect Express (PCIe) slots.

In another embodiment, the I/O expansion module further comprises a power supply configured to provide a first supply voltage to the expansion slot. In another embodiment, the expansion slot is communicatively coupled to the backplane slot via a conversion module coupled to the backplane slot. In another embodiment, the expansion slot is configured to receive a peripheral component. In another embodiment, the I/O expansion module further comprises a cooling device configured to cool the peripheral component.

In another embodiment, the peripheral component comprises an I/O or networking device.

In an embodiment, the expansion slot is communicatively coupled to the backplane slot via a data cable. In another embodiment, the expansion module is configured to be coupled to the computing device by a power cable and receive a second supply voltage from the computing device.

In an embodiment, the computing device comprises a server.

In accordance with another aspect of the present disclosure, a system for front input/output (I/O) expansion of a computing device comprises a computing device including a backplane, and a backplane slot disposed on the backplane. The system further includes an I/O expansion module external to the computing device. The I/O expansion module comprises a first substrate, and an expansion slot disposed on the first substrate. The expansion slot is configured to be communicatively coupled to the backplane slot.

In an embodiment, the first substrate comprises a riser card. In another embodiment, the expansion slot comprises a peripheral component expansion slot. In another embodiment, the I/O expansion module further comprises a power supply configured to provide a first supply voltage to the expansion slot.

In another embodiment, the computing device further comprises a conversion module coupled to the backplane slot configured to communicatively coupled the expansion slot to the backplane slot. In another embodiment, the conversion module is configured to provide a second supply voltage to the expansion slot. In another embodiment, the system further comprises an I/O or networking device coupled to the expansion slot.

In another embodiment, the computing device comprises a server.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

DETAILED DESCRIPTION

Figure 1:
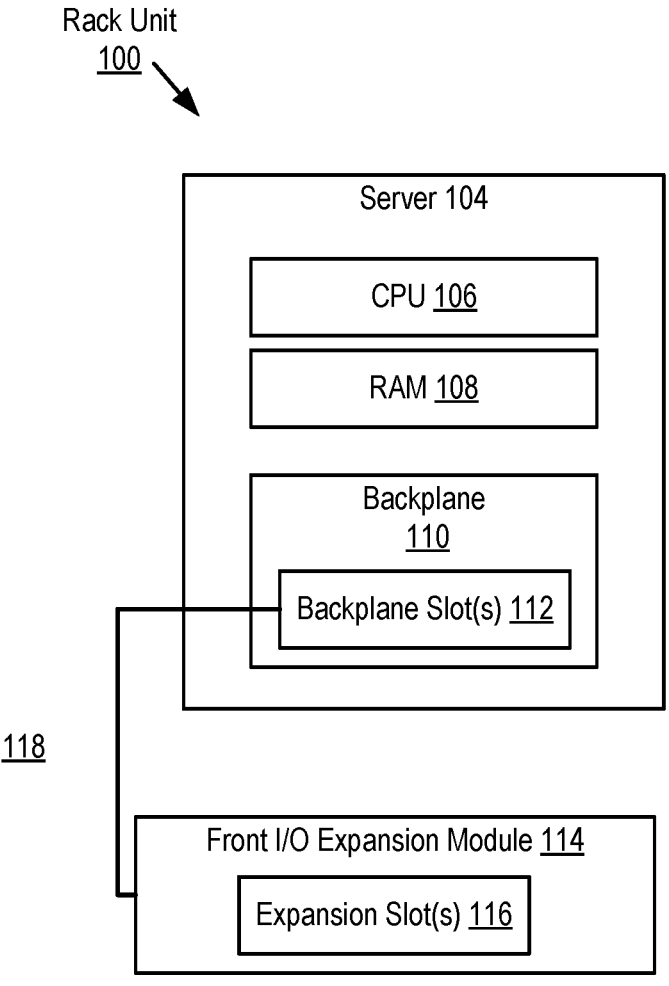
FIG. 1 shows a block diagram of an example rack-mounted system including a front input/output (I/O) expansion module for a computing device in accordance with embodiments of the present disclosure.

Exemplary methods, apparatus, and systems for a front input/output (I/O) expansion module for a computing device in accordance with the present disclosure are described with reference to the accompanying drawings. FIG. 1 shows a block diagram of an example rack-mounted system including a front input/output (I/O) expansion module for a computing device in accordance with embodiments of the present disclosure. Various embodiments provide for an expansion module that allows a server to add front I/O capabilities by routing high speed peripheral interface lanes from backplanes of the server to an external I/O expansion enclosure to allow coupling of peripheral components such as network cards, graphical processing units (GPUs), and other I/O devices.

The example system of FIG. 1 includes a rack unit 100, such as a standard 19 inch rack for mounting multiple electronic equipment modules. The example rack unit 100 of FIG. 1 includes a server 104. The server 104 includes a central processing unit (CPU) 106, and main computer memory in the form of Random Access Memory (RAM) 108. The server 104 further includes a backplane 110 that includes one or more backplane slots 112. In particular embodiments, the backplane 110 is a nonvolatile memory express (NVMe) backplane and the backplane slots 112 are NVMe drive slots configured to receive one or more storages devices such as a solid-state drive (SSDs). In another particular embodiment, the backplane slots 112 are Peripheral Component Interconnect Express (PCIe) slots.

The example server 104 of FIG. 1 may be one of multiple servers included in the rack unit 100. The rack unit 100 further includes a front I/O expansion module 114. The front I/O expansion module 114 includes one or more expansion slots 116. In particular embodiments, the one or more expansion slots 116 are PCI and/or PCIe slots. The backplane slots 112 of the backplane 110 of the server 104 are communicatively coupled with the expansion slots 116 of the front I/O expansion module 114 via one or more cables 118. In a particular embodiment, the expansion slots 116 are peripheral component expansion slots configured to be coupled to peripheral components such as storage devices. In an embodiment, the one or more cables 118 may include a data cable to provide I/O communication between many of the backplane slots 112 and a particular one of the expansion slots 116. In another embodiment, the one or more cables 118 may include a power cable to provide a supply voltage from the backplane 110 of the server 104 to the front I/O expansion module 114.

Figure 2:
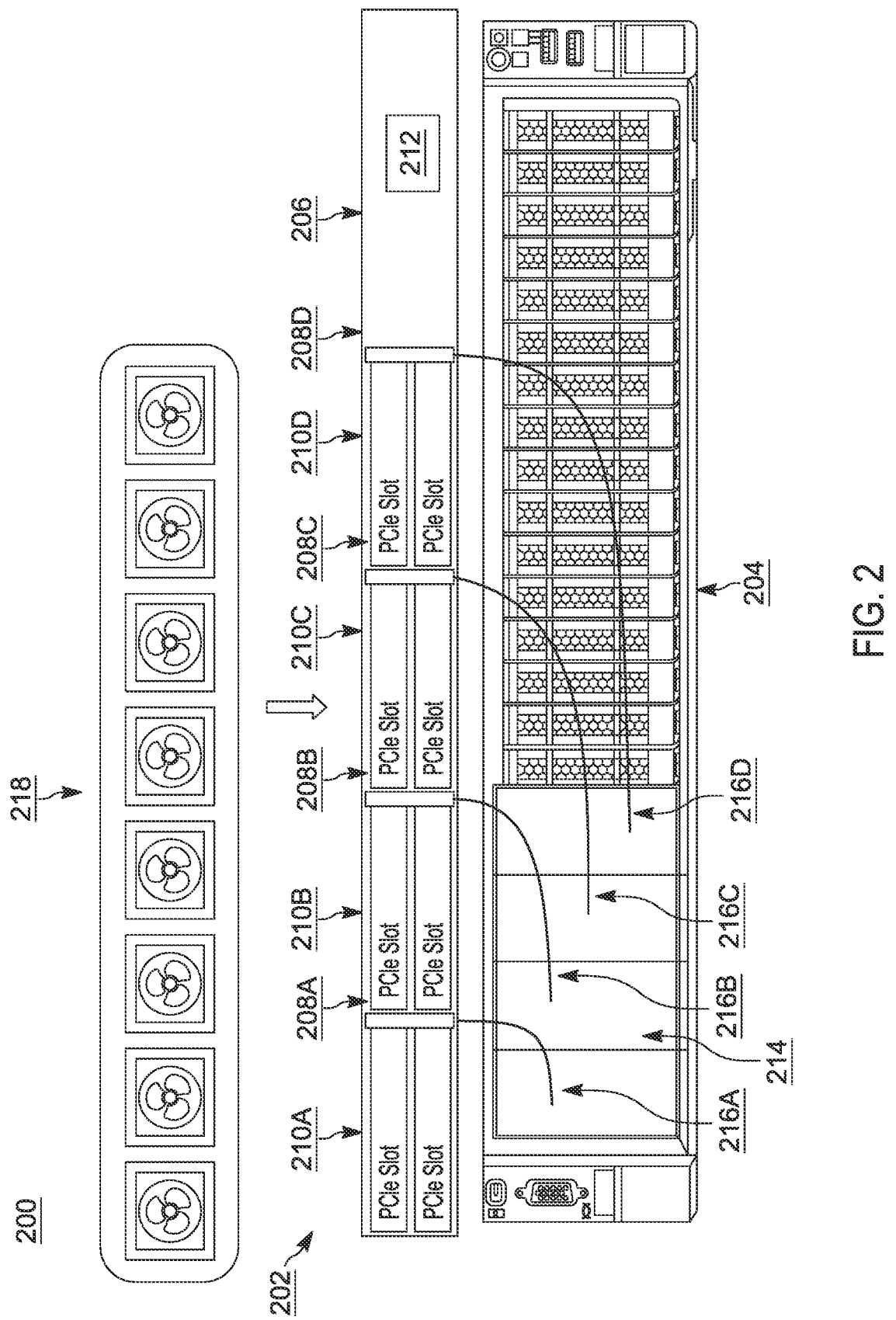
FIG. 2 shows a block diagram of an example system including a front I/O expansion module for a server in accordance with embodiments of the present disclosure.

For further explanation, FIG. 2 shows a block diagram of an example system 200 including a front I/O expansion module 202 for a server 204 in accordance with embodiments of the present disclosure. In an embodiment, the example front I/O expansion module 202 is an example of the front I/O expansion module 114 of FIG. 1 and the server 204 is an example of the server 104 of FIG. 1. In a particular embodiment, the server 204 is a general-purpose server having space for storage devices in the front and backplane I/O in the back of the server 204. The front I/O expansion module 202 includes a front I/O expansion enclosure 206 configured to enclose various components of the front I/O expansion module 202. The front I/O expansion module 202 includes a first PCIe riser card 208A, a second PCIe riser card 208B, a third PCIe riser card 208C, and a fourth PCIe riser card 208D. The first PCIe riser card 208A includes a pair of PCIe slots 210A, the second PCIe riser card 208B includes a pair of PCIe slots 210C, and the fourth PCIe riser card 208D includes a pair of PCIe slots 210D. The front I/O expansion module 202 may optionally include an expansion power supply 212 configured for supplying a supply voltage power to the first PCIe riser card 208A, the second PCIe riser card 208B, the third PCIe riser card 208C, and the fourth PCIe riser card 208D.

The server 204 includes a PCIe conversion module 214 configured to plug into existing hard drive bays to route PCIe lanes from an NVMe drive backplane of the server 204 to the front I/O expansion module 202 via cables 216A, 216B, 216C, and 216D coupled to respective ones of the first PCIe riser card 208A, the second PCIe riser card 208B, the third PCIe riser card 208C, and the fourth PCIe riser card 208D. In particular embodiments, one or more of the cables 216A, 216B, 216C, and 216D may further supply power from the NVMe drive backplane to the front I/O expansion module 202. The first PCIe riser card 208A, the second PCIe riser card 208B, the third PCIe riser card 208C, and the fourth PCIe riser card 208D functions as interfaces between the cable connections from the PCIe conversion module 214 and the PCIe slots 210A, 210B, 210C, and 210D. In one or more embodiments, the PCIe slots 210A, 210B, 210C, and 210D are configured to be connected to backplane slots where storage devices would be previously plugged in.

In an embodiment, the front I/O expansion module 202 may further include one or more cooling fans 218 to provide cooling to peripheral components connected to the PCIe slots 210A, 210B, 210C, and 210D.

Figure 3B:
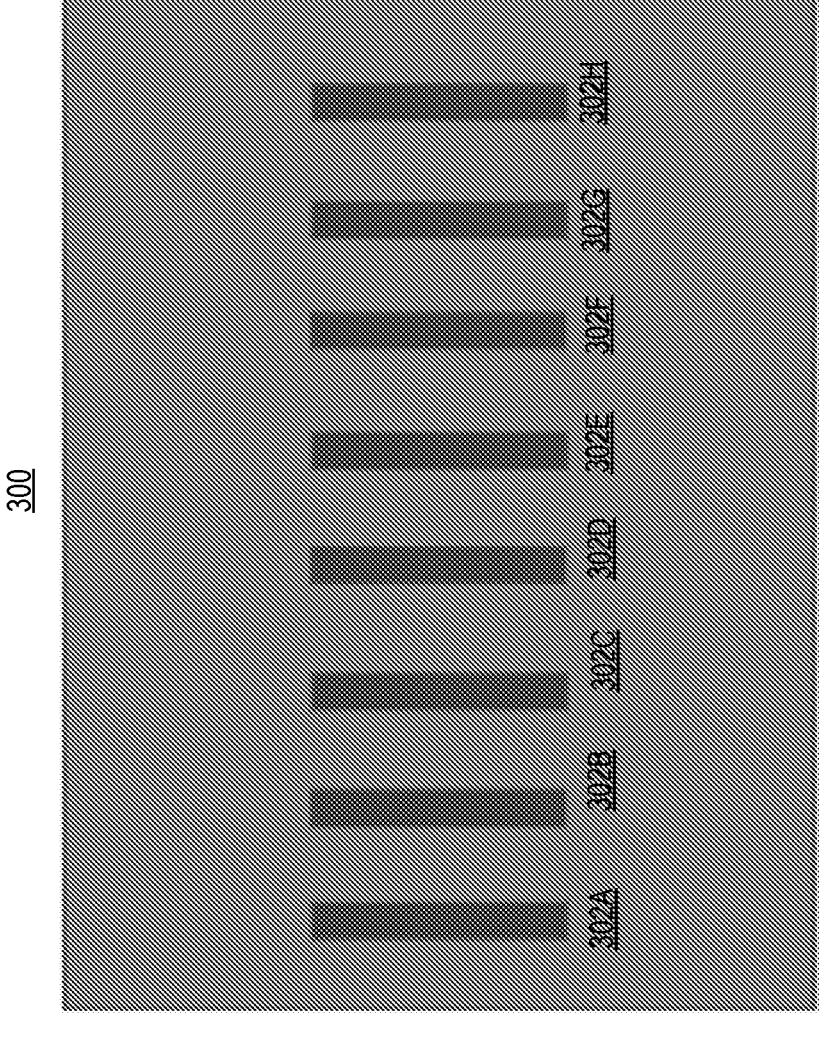
FIGS. 3A-3B show block diagrams of a drive backplane of the server of FIG. 2 in accordance with embodiments of the present disclosure.
Figure 3A:
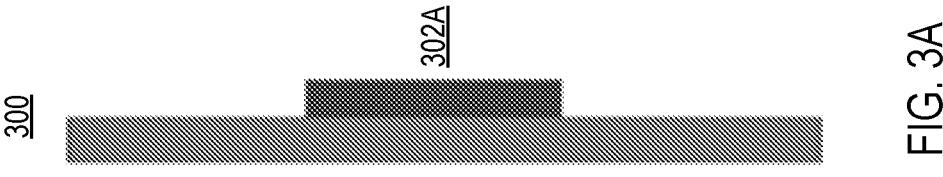

For further explanation, FIGS. 3A-3B shows a block diagram of a drive backplane 300 of the server 204 of FIG. 2 in accordance with embodiments of the present disclosure. FIG. 3A shows a side view of the drive backplane 300 and FIG. 3B shows a front view of the drive backplane 300. The drive backplane 300 includes a first PCIe drive slot 302A, a second PCIe drive slot 302B, a third PCIe drive slot 302C, a fourth PCIe drive slot 302D, a fifth PCIe drive slot 302E, a sixth PCIe drive slot 302F, a seventh PCIe drive slot 302G, and an eighth PCIe drive slot 302H. Each of the PCIe drive slots 302A-302H include HDD signal and power connectors configured to be coupled with the front I/O expansion module 202 of FIG. 2. In a particular embodiment, each of the PCIe drive slots 302A-302H are NVMe drive slots that carry four PCIe lanes. Accordingly, in a particular embodiment a 2U server may have up to 24 front NVMe drive slots and a full 2U server can support up to 96 front PCIe lanes (e.g., 6×16 cards).

Figure 4:
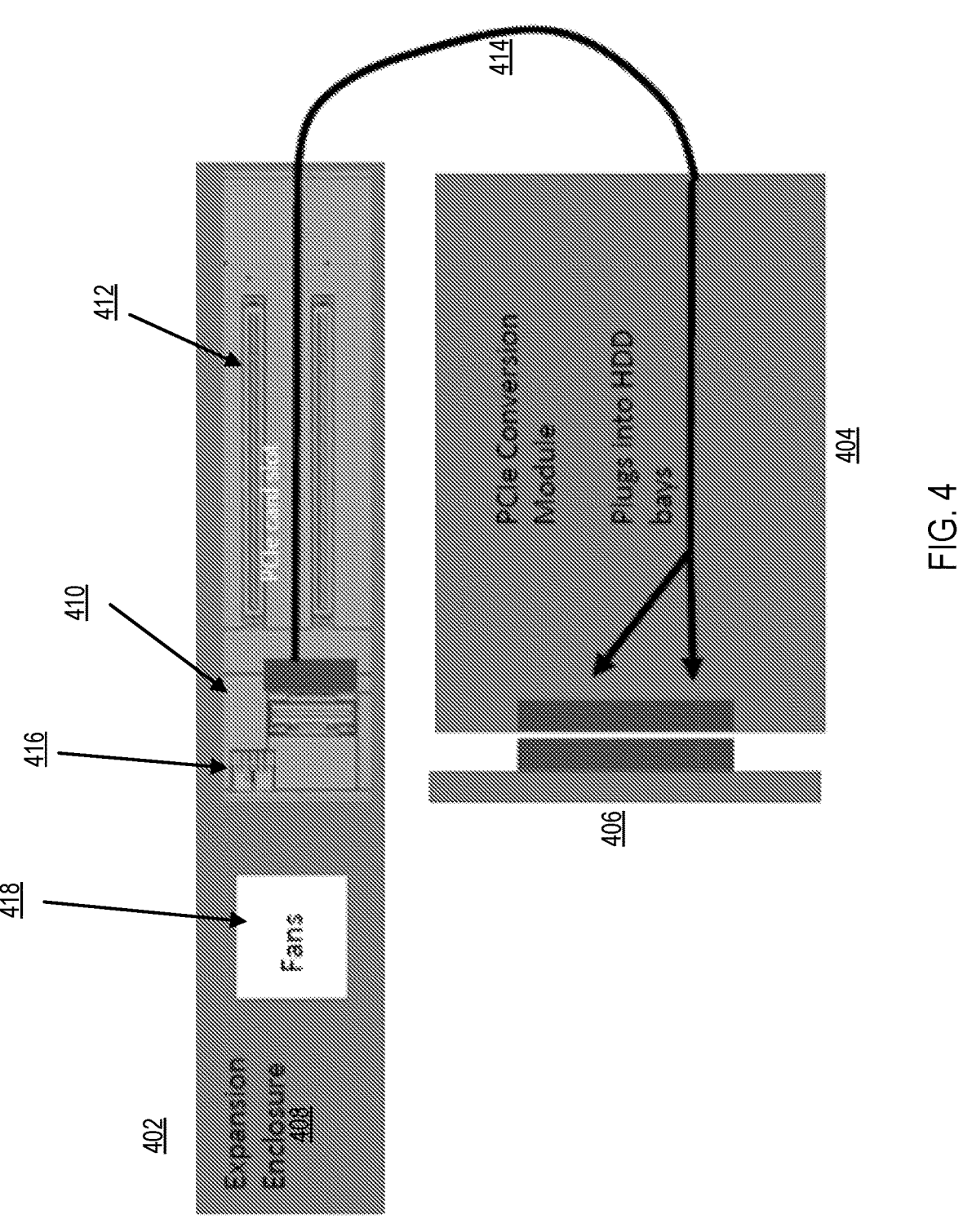
FIG. 4 shows a block diagram of another example system including a front I/O expansion module and conversion module for a server in accordance with embodiments of the present disclosure.

For further explanation, FIG. 4 shows a block diagram of another example system 400 including a front I/O expansion module 402 and a PCIe conversion module 404 for a server in accordance with embodiments of the present disclosure. The PCIe conversion module 404 plugs into HDD bays of the server and is coupled to a NVMe backplane 406 of the server. The front I/O expansion module 402 includes an expansion enclosure 408. The expansion enclosure 408 includes a PCIe riser card 410 including two PCIe card slots 412. The PCIe riser card 410 is configured to plug into external power and/or PCIe cables 414 from the PCIe conversion module 404. In a particular embodiment, the PCIe riser card in a 1U server configuration accommodates two PCIe cards per riser, and up to four risers may be installed in the front I/O expansion module 402 to utilize up to eight PCIe cars in total. In a particular embodiment, the cables inside the PCIe conversion module 404 can directly plug into the NVMe backplane 406 with a "Y" cable to convert 2×NVME drive slots to 1×8 PCIe cable and 1× power cable.

In an embodiment, the PCIe riser card 410 includes a power connector 416 to supply power to the PCIe riser card 410 from a power supply and/or the PCIe conversion module 404.

In another embodiment, the front I/O expansion module 402 includes fans 418 to cool components of the front I/O expansion module 402 such as I/O or networking devices coupled to the PCIe card slots 412. Accordingly, in various embodiments, I/O capabilities provided by the NVMe backplane 406 in the back of a server are carried to the front I/O expansion module 402 at the front of the server.

Figure 5A:
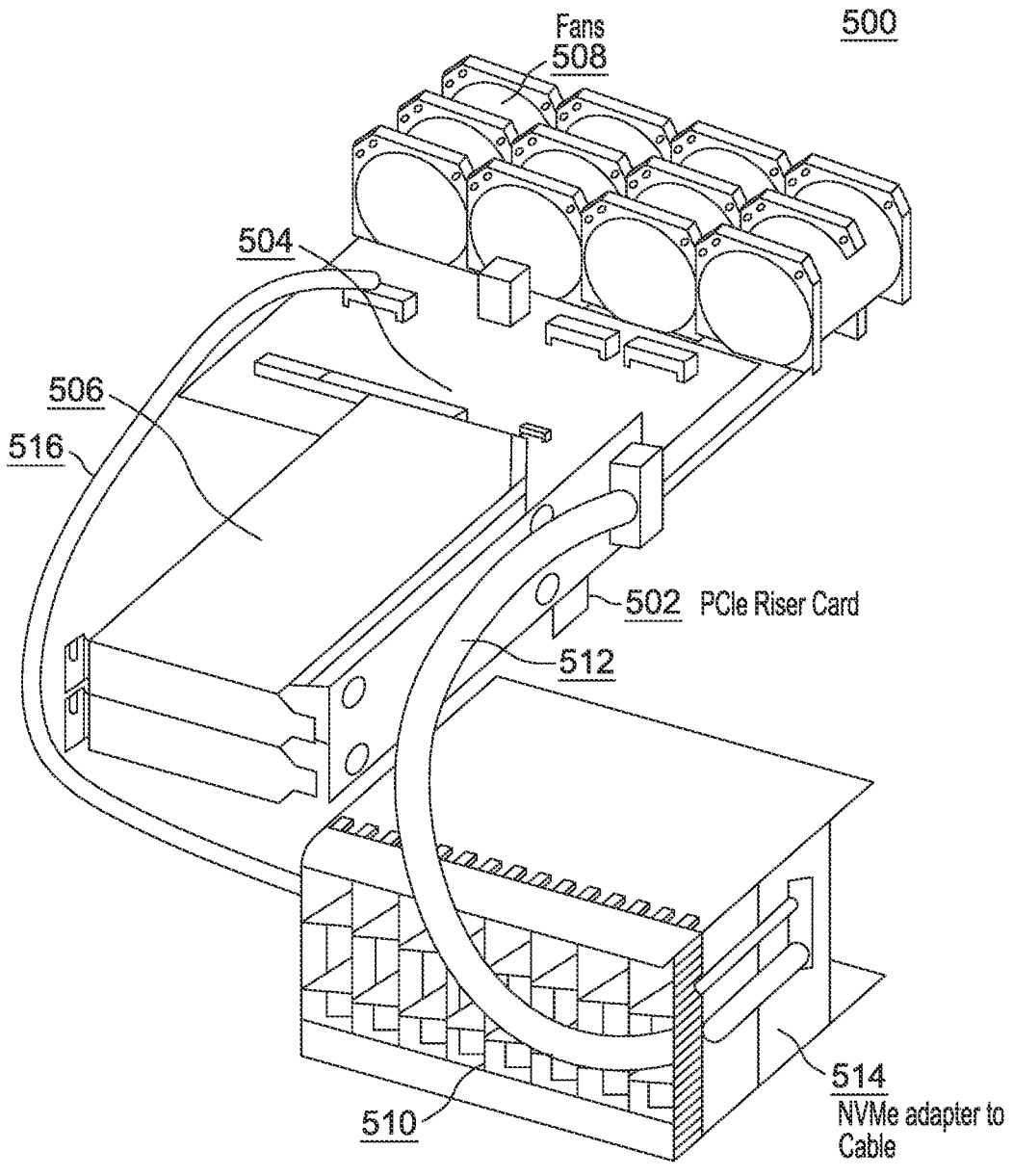
FIGS. 5A-5B show block diagrams of an example of a front I/O expansion module in accordance with embodiments of the present disclosure.
Figure 5B:
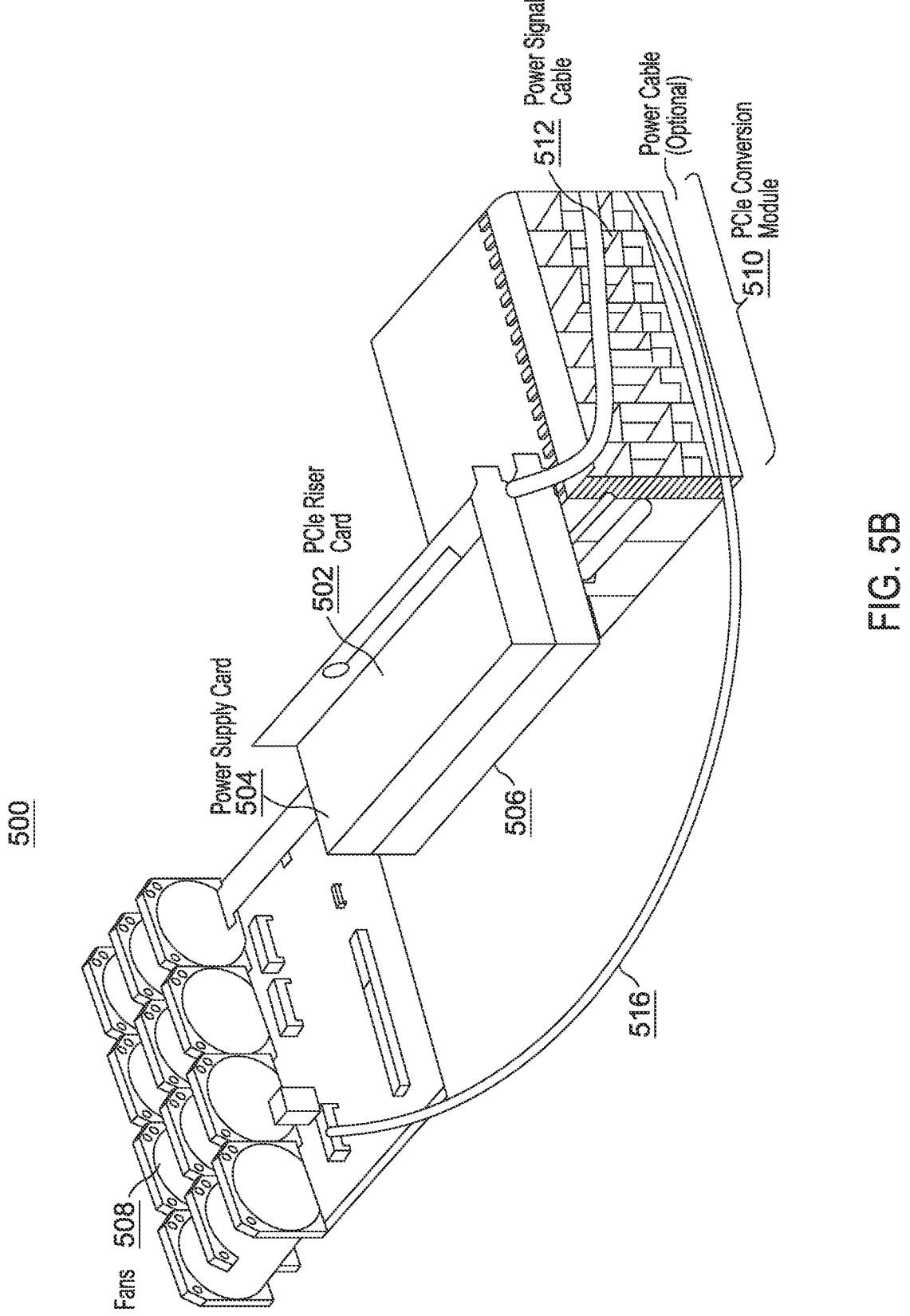

For further explanation, FIGS. 5A-5B show block diagrams of an example of a front I/O expansion module 500 in accordance with embodiments of the present disclosure. FIG. 5A shows a first perspective view and FIG. 5B shows a second perspective view of the front I/O expansion module 500. The front I/O expansion module includes a first substrate including a PCIe riser card 502 coupled to a second substrate including a power supply card 504. The PCIe riser card 502 has one or more I/O or networking devices 506 coupled to corresponding PCIe slots of the PCIe riser card 502. The power supply card 504 is configured to supply power to the PCIe riser card 502. The power supply card 504 further includes one or more fans 508 configured to cool the PCIe riser card 502 and/or the I/O or networking devices 506.

A PCIe conversion module 510 configured to be coupled with a backplane of a server is connected to the PCIe riser card 502 via a PCIe signal cable 512. In a particular embodiment, the PCIe conversion module 510 includes a NVMe adapter 514 configured to couple the PCIe signal cable 512 to the PCIe conversion module 510. In a particular embodiment, the PCIe riser card 502 could include a retimer circuit to amplify the signals received from the PCIe conversion module 510 to maintain signal integrity to the front I/O expansion module. The PCIe conversion module 510 may optionally include a power cable 516 coupled between the PCIe conversion module 510 and the power supply card 504. The power cable 516 is configured to provide a supply voltage from the PCIe conversion module 510 to the power supply card 504.

In view of the explanations set forth above, readers will recognize that the benefits of a front input/output (I/O) expansion module for a computing device according to embodiments of the present disclosure include maximizing physical access to the front of a server while minimizing required physical access to the back of the server; allowing general-purpose servers to support front I/O; reducing development expense by leveraging off-the-shelf products that meet datacenter requirements, especially for low-volume niche use cases; and others as will occur to readers of skill in the art.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. An input/output (I/O) expansion enclosure, comprising:
   a rackmountable chassis;
   a riser card mounted within the chassis, the riser card comprising one or more I/O expansion card slots each configured to receive a corresponding I/O card; and
   a cable configured to communicatively couple the one or more I/O expansion card slots of the riser card to a conversion module installed in a Non-Volatile Memory Express (NVME) drive slot on a NVME backplane of a rackmountable computing device external to the rackmountable chassis of the I/O expansion enclosure.

2. The I/O expansion enclosure of claim 1, wherein the one or more I/O expansion card slots comprise at least one Peripheral Component Interconnect Express (PCIe) slot.

3. The I/O expansion enclosure of claim 1, further comprising:
   a power supply configured to provide power to the one or more I/O expansion card slots.

4. The I/O expansion enclosure of claim 1, wherein the NVME drive slot is a first NVME drive slot, and wherein the conversion module is configured to couple with a plurality of NVME drive slots of the rackmountable computing device, the plurality of NVME drive slots including the first NVME drive slot.

5. The I/O expansion enclosure of claim 4, wherein the cable is coupled to the first NVME drive slot and a second NVME drive slot of the plurality of NVME drive slots.

6. The I/O expansion enclosure of claim 1, wherein a first I/O expansion card slot of the one or more I/O expansion card slots is configured to receive a peripheral component.

7. The I/O expansion enclosure of claim 6, wherein the peripheral component comprises a storage device.

8. The I/O expansion enclosure of claim 6, wherein the peripheral component comprises a graphics processing unit (GPU).

9. The I/O expansion enclosure of claim 6, further comprising a cooling device configured to cool the peripheral component.

10. The I/O expansion enclosure of claim 6, wherein the peripheral component comprises a networking device.

11. The I/O expansion enclosure of claim 1, wherein the riser card comprises a plurality of I/O expansion card slots.

12. The I/O expansion enclosure of claim 1, wherein the cable is configured to carry both data signals and power.

13. The I/O expansion enclosure of claim 1, wherein the riser card mounted in the chassis is a first riser card of a plurality of riser cards mounted in the chassis.

14. The I/O expansion enclosure of claim 1, wherein the rackmountable computing device comprises a server.

15. A system comprising:
   a rack unit comprising one or more rack spaces;
   a computing device installed in a first rack space of the rack unit, the computing device comprising a peripheral component bay accessible from a first side of the computing device, wherein the peripheral component bay comprises a Non-Volatile Memory Express (NVME) storage device backplane having NVME storage device slots each configured to receive a corresponding NVME storage device;
   a conversion module installed in the peripheral component bay of the computing device and coupled to at least one of the storage device slots present on the storage device backplane; and
   an input/output (I/O) expansion module external to the computing device and installed in a second rack space, the I/O expansion module comprising:
      a chassis; and
      a riser card mounted within the chassis, the riser card comprising one or more I/O expansion card slots each configured to receive a respective I/O expansion card; and
      a cable connecting the I/O expansion module to the computing device and configured to communicatively couple wherein the one or more I/O expansion card slots of the riser card to the NVME storage device backplane of the computing device.

16. The system of claim 15, wherein the I/O expansion module further comprises a power supply configured to provide a first supply power to the one or more I/O expansion card slots.

17. The system of claim 15, wherein the cable is configured to carry operating power from the computing device to the I/O expansion module.

18. The system of claim 17, wherein the cable is coupled to both first and second NVME storage device slots of the NVME storage device backplane.

* * * * *